US008820160B2

(12) United States Patent
Doering et al.

(10) Patent No.: US 8,820,160 B2
(45) Date of Patent: Sep. 2, 2014

(54) METHOD FOR PRODUCING A SPEED SENSOR ELEMENT

(75) Inventors: Andreas Doering, Düsseldorf (DE); Edmond De Volder, Sint-Niklaas (BE); Dietmar Huber, Eichstätt (DE); Jakob Schillinger, Gaimersheim (DE); Martin Watzlawik, Maintal (DE)

(73) Assignee: Continental Teves AG Co. oHG (DE)

( * ) Notice: Subject to any disclaimer, the term of this patent is extended or adjusted under 35 U.S.C. 154(b) by 684 days.

(21) Appl. No.: 13/121,494

(22) PCT Filed: Oct. 1, 2009

(86) PCT No.: PCT/EP2009/062749

§ 371 (c)(1), (2), (4) Date: Mar. 29, 2011

(87) PCT Pub. No.: WO2010/037810

PCT Pub. Date: Apr. 8, 2010

(65) Prior Publication Data

US 2011/0175598 A1 Jul. 21, 2011

(30) Foreign Application Priority Data

Oct. 2, 2008 (DE) ......................... 10 2008 049 956
Dec. 19, 2008 (DE) ......................... 10 2008 064 046

(51) Int. Cl.

| | |
|---|---|
| ***G01C 19/54*** | (2006.01) |
| ***H01L 21/00*** | (2006.01) |
| ***B29C 45/14*** | (2006.01) |
| ***G01D 11/24*** | (2006.01) |
| *B29L 31/30* | (2006.01) |

(52) U.S. Cl.

CPC . *B29C 45/14655* (2013.01); *H01L 2224/32245* (2013.01); *H01L 2224/48247* (2013.01); *H01L 2224/73265* (2013.01); *H01L 2224/48137* (2013.01); *B29L 2031/3061* (2013.01); *H01L 2224/48091* (2013.01); *H01L 2224/45144* (2013.01); *G01D 11/245* (2013.01)

USPC ......................................... 73/504.12; 438/51

(58) Field of Classification Search

USPC ......................................... 438/51; 73/504.12

See application file for complete search history.

(56) References Cited

U.S. PATENT DOCUMENTS 5,006,797 A 4/1991 Smith
5,429,735 A * 7/1995 Johnson et al. .......... 204/403.11

(Continued)

FOREIGN PATENT DOCUMENTS

DE 41 11 568 A1 10/1992
DE 10 333 035 A1 2/2005

(Continued)

OTHER PUBLICATIONS

Amesoeder, S. et al: "Plasma Sorgt Fuer Festen Verbund", Kunstoffe, Carl Hanser Verlag, Munchen, DE, Bd. 93, Nr. 9, Jan. 2003. Seiten 124-129, XP001171704, ISSN: 0023-5563.

(Continued)

*Primary Examiner* — Evan Pert
(74) *Attorney, Agent, or Firm* — RatnerPrestia

(57) ABSTRACT

A method for producing a sensor element, wherein at least parts of the sensor element are subjected to at least one plasma treatment process during production. The plasma treatment process may be either a plasma cleaning process and/or a plasma activation process. During the plasma treatment process, a base element and/or a carrier element of the sensor element is subjected to a plasma treatment process before a placement process and/or before a contact-connecting process with electrical connection means. The sensor element is equipped with at least one measurement probe element and/or at least one electronic circuit. This method is used to produce a sensor element, such as a speed sensor element, that may be used in a motor vehicle.

19 Claims, 4 Drawing Sheets

(56) References Cited

U.S. PATENT DOCUMENTS

| | | | | |
|---|---|---|---|---|
| 5,440,153 | A * | 8/1995 | Male et al. | 257/204 |
| 5,542,171 | A | 8/1996 | Juskey et al. | |
| 5,909,633 | A * | 6/1999 | Haji et al. | 438/612 |
| 5,953,108 | A * | 9/1999 | Falb et al. | 356/4.08 |
| 5,998,989 | A | 12/1999 | Lohberg | |
| 6,334,361 | B1 | 1/2002 | De Volder et al. | |
| 6,844,214 | B1 * | 1/2005 | Mei et al. | 438/52 |
| 2003/0033875 | A1 | 2/2003 | Iijima et al. | |
| 2004/0080314 | A1 | 4/2004 | Tsujii et al. | |
| 2004/0232906 | A1 | 11/2004 | Taneyhill | |
| 2005/0115317 | A1 | 6/2005 | Fouquet | |
| 2005/0179557 | A1 | 8/2005 | Matsumoto et al. | |
| 2005/0275141 | A1 | 12/2005 | Lange | |
| 2006/0118239 | A1 | 6/2006 | Condrashoff et al. | |
| 2006/0171127 | A1 | 8/2006 | Kadoya et al. | |
| 2007/0120555 | A1 | 5/2007 | Tokuhara | |
| 2007/0195331 | A1 | 8/2007 | Bain et al. | |
| 2007/0262249 | A1 | 11/2007 | Lee et al. | |
| 2008/0105988 | A1 * | 5/2008 | Haag | 257/784 |
| 2009/0061555 | A1 * | 3/2009 | Nagano | 438/69 |
| 2009/0212285 | A1 * | 8/2009 | Nishi et al. | 257/53 |
| 2010/0175921 | A1 | 7/2010 | Büyükbas et al. | |

FOREIGN PATENT DOCUMENTS

| | | | |
|---|---|---|---|
| DE | 10 333 197 | A1 | 2/2005 |
| DE | 10 2004 062 087 | A1 | 4/2006 |
| DE | 102004060297 | A1 | 6/2006 |
| DE | 10 2007 037 910 | A1 | 4/2008 |
| DE | 20-2007-002582 | U1 | 8/2008 |
| DE | 10 2007 046 304 | A1 | 4/2009 |
| EP | 1 262 779 | A2 | 12/2002 |
| EP | 1 811 566 | A2 | 7/2007 |
| FR | 2 864 700 | | 7/2005 |
| JP | 2000-108205 | A | 4/2000 |
| JP | 2000-206130 | A | 7/2000 |
| WO | WO 95/17680 | | 6/1995 |
| WO | WO 97/36729 | | 10/1997 |
| WO | WO 2007/123310 | A1 | 11/2007 |
| WO | WO 2008/031657 | A1 | 3/2008 |
| WO | WO 2008/113336 | A2 | 9/2008 |

OTHER PUBLICATIONS

Office Action corresponding to U.S. Appl. No. 13/121,542 dated Jun. 26, 2014.

* cited by examiner

METHOD FOR PRODUCING A SPEED SENSOR ELEMENT

CROSS REFERENCE TO RELATED APPLICATIONS

This application is the U.S. National Phase Application of PCT International Application No. PCT/EP2009/062749, filed Oct. 1, 2009, which claims priority to German Patent Application No. 10 2008 049 956.0, filed Oct. 2, 2008, and German Patent Application No. 10 2008 064 046.8, filed Dec. 19, 2008, the contents of such applications being incorporated by reference herein.

FIELD OF THE INVENTION

The invention relates to a method for producing a sensor element, to a sensor element, and to the use of the sensor element in motor vehicles.

BACKGROUND OF THE INVENTION

Document WO 95/17680, which is incorporated by reference, proposes a wheel rotational speed sensor element comprising a leadframe, which is populated on both sides and has a housing with a measurement probe element and an electronic circuit, arranged on one side of the leadframe, and a magnet, arranged on the other side of the leadframe.

Document WO 97/36729, which is incorporated by reference, proposes a method for producing a wheel rotational speed sensor element comprising a first housing part, which has positioning elements with integrated melting elements, wherein said first housing part is surrounded by a second housing part in a plastic injection molding process.

SUMMARY OF THE INVENTION

Aspects of the invention are based on the objective of proposing a method for producing a sensor element which can be carried out cost-effectively and/or enables a high production quality of the sensor element.

The invention is based on the concept of subjecting at least parts of the sensor element to at least one plasma treatment process during production.

Various methods for generating plasmas for plasma treatment can be used, such as, for example, applying high-frequency AC voltages to a gas or the use of DC current in this regard and/or exciting a gas with microwaves. Exemplary gas mixtures for plasma treatment contain oxygen, argon, hydrogen and/or nitrogen. The type of mixture depends on the specific requirements made of the plasma treatment process, which arise, for example, from the type of contamination and the material treated. Depending on the type of gas mixture, the plasma has an oxidizing or reducing or activating effect. Oxidizing plasmas are suitable for removing organic impurities, while reducing plasmas are also suitable for removing inorganic deposits and/or for breaking down oxide deposits.

The plasma treatment process preferably comprises a plasma cleaning process and/or a plasma activation process.

A plasma cleaning process is preferably understood to mean a dry, contactless, chemical and/or physical, non-abrasive cleaning method with which extremely high cleaning qualities can be obtained. Organic impurities may be converted into water vapor, carbon dioxide and/or $CH_4$, for example, by chemical reaction with free radicals of the plasma. For the chemical removal of contamination, the plasma contains oxygen or hydrogen or argon, for example. In this case, oxygen is suitable for removing organic contaminations and hydrogen for removing inorganic and/or organic substances and also for reducing oxides. The cleaning process may be a combination of a physical and a chemical active process or alternatively preferably exclusively a chemical active process (ion-free).

Physical: if the object to be cleaned is connected, for example, to a cathode for plasma generation, on account of the applied electric field positive ions from the plasma are accelerated in the direction thereof. Upon impingement, said ions detach atoms and molecules from the surface as a result of direct momentum transfer.

Chemical: excited oxygen and oxygen ions form, upon reaction with hydrocarbons, for example, carbon dioxide and water. Excited hydrogen forms halides, sulfides, $CH_x$ and water vapor, for example.

A plasma activation process is preferably understood to mean a plasma treatment process for increasing the surface tension or adhesion of the body to be treated or activated. In this case, the adhesion between a substrate or the body and a material to be applied, e.g. molding material, is reinforced. The substrate or said body can therefore be wetted or adhesively enveloped more easily by a liquid, or also an agent or substance. In this case, the contact angle of a drop on the body is a customary measure of the surface tension of the body. If the surface of the body is hydrophobic (water-repellent), it has a low surface tension. By means of a plasma activation process, an increase in the surface tension is achieved like with an adhesion promoter. After the plasma activation process, the surface of the body is hydrophilic or readily wettable, the contact angle is reduced and the tendency toward delamination is lower. By way of example, nitrogen and/or oxygen are/is used for a plasma activation process. A plasma activation process is used for example for improving the adhesion of adhesives or coatings on specific plastics.

Preferably, a base element and/or a carrier element of the sensor element is subjected to a plasma treatment process, such as a plasma cleaning process, before a placement process and/or before a contact-connecting process with electrical connection means.

A base element is preferably understood to mean a leadframe and/or a structure element of the sensor element and/or a carrier strip/carrier film or an MID element (molded interconnect device) which comprises a plastic body or an injection-molded body having interconnects which are applied thereto and/or enclosed thereby and which are formed from metal and/or a conductive plastic, for example.

Preferably, at least parts of the sensor element are subjected to a plasma treatment process, such as a plasma activation process, before at least one encapsulation by molding process, such as a plastic injection molding process. This takes place preferably after at least one placement process.

The method may comprise a plasma cleaning process before a contact-connecting process for the purpose of significantly reducing the susceptibility to corrosion and a plasma activation process before an encapsulation by molding process for the purpose of significantly reducing the susceptibility to delamination.

The sensor element is preferably equipped with at least one measurement probe element and/or at least one electronic circuit, which are arranged directly or indirectly on the base element and/or the carrier element, preferably on a carrier support or a bonding island or a die pad of the base element. Preferably, the measurement probe element and/or the electrical circuit are electrically contact-connected according to a ball-stitch-on-ball bonding method (BSOB) or a stitch-on-bump bonding method (SOB), as a result of which a high tensile and shear strength of the electrical contact-connections can be achieved. Alternatively, preferably, the measurement probe element and/or the electrical circuit are electrically contact-connected according to a wedge-ball bonding method or according to a reverse-stitch-on-ball bonding method (RSAB).

A measurement probe element is preferably understood to mean a magnetoelectric transducer element, such as an AMR, GMR, or some other magnetoresistive element or a Hall element, which particularly preferably has a bridge structure and is also referred to as bridge die. The measurement probe element may have combined magnetoelectric transducer elements having different modes of operation.

The base element and/or the carrier element are preferably equipped with in each case at least one component on both sides.

The measurement probe element and at least one part of the base element and/or of the carrier element are preferably encapsulated by molding, as a result of which a first housing is formed. In addition, at least one part of the base element and/or of the carrier element and preferably an electronic protection element are encapsulated by molding, as a result of which a second housing is formed. In this case, the first and second housings are preferably at a defined distance from one another. Preferably, the first and the second housing are jointly encapsulated by molding in an additional encapsulation by molding process, for example by means of an overmold injection-molding process, as a result of which a common third housing is formed.

An overmold injection-molding process is preferably understood to mean an injection molding process in which a thermoplastic is pressed into an outer mold, for example a customer-specific outer mold, such as by means of a screw drive. Preferably, a viscose molding material, for example polyamide, is forced into the injection mold or mold cavity by means of an extruder screw, after which the thermoplastic material solidifies by cooling on the wall of the injection mold. The finished injection-molded component is then removed from the mold.

It is preferably the case that, for example at the end of the production method, the sensor element is subjected to an additional plasma treatment process, such as to a plasma cleaning process, as a result of which the exposed contacts or connection means of the sensor element corrode or tend toward corrosion to a relatively small extent. Moreover, on account of the plasma cleaning process, it is possible to dispense with an electroplating process, for example tin-plating or nickel-plating, for the protection of the exposed contacts or connection means. Afterward, the sensor element may be packaged directly in an airtight fashion.

The method for producing the sensor element preferably comprises the following steps:

Stamping out a base element or leadframe or carrier strip from a blank, which is formed, for instance, from a metal sheet. Alternatively, a carrier strip/carrier film or an MID element is used as a base element. A surface coating and/or at least one contact location are subsequently applied on at least one side of the leadframe or base element. The leadframe or base element is subsequently equipped with at least one electronic component.

It is preferably the case that, in the course of equipping the base element, firstly a first side or a first area of the base element is provided with a first adhesive (dispense). Said first adhesive is optionally electrically conductive or insulating and has a relatively good thermal conductivity. Afterward, at least one electronic circuit, also referred to as ASIC die, and/or at least one measurement probe element, which is preferably embodied as a bridge, is applied to said first side. The ASIC die preferably serves as a mounting carrier for the measurement probe element. In this case, the measurement probe element is arranged on the ASIC die by means of flip-chip mounting, for example.

The ASIC die and the measurement probe element can be embodied as an integrated component.

Preferably, subsequently the adhesive is heated or the leadframe or base element and also the components on the first side of the base element are heated, as a result of which the connection by means of the first adhesive cures.

Subsequently, the leadframe or base element may be subject to a plasma treatment process, such as a plasma cleaning process, as a result of which the surface of the base element and of the components is at least partly cleaned of corrosion-promoting sulfide, halogen and/or carbon contaminations. In addition, the oxide layer is reduced. This is advantageous for ensuring reliable electrical contact-connections between bonding wires and the leadframe or the base element and/or to at least one contact location of the ASIC die or measurement probe element. In addition, this cleaning serves to achieve relatively high impermeability in the course of the leadframe or the base element being at least partly encapsulated by injection molding.

After the process of equipping the leadframe or base element or a corresponding placement process and, for example, after a subsequent plasma treatment process, preferably at least the ASIC die and/or the measurement probe element are electrically conductively connected to one another and/or to the leadframe or base element by means of a wire bonding process. In this case, preferably, bumps or bonding bumps or solder bumps or a bondable layer are applied in a suitable manner firstly at all contact locations on the base element and on contact-connecting pads or on contact-connecting means of the corresponding components. Afterward, the respective bonding wires are pulled, this being carried out according to the so-called ball-stitch-on-ball bonding method (BSOB) or stitch-on-bump bonding method (SOB). Preferably, the bonding wires that have contact with the ASIC die are pulled away from the contact-connecting pads of the ASIC die toward the respective target point and the bump of the electrical connection there. By virtue of this type of bonding process, undesirable thermal and mechanical influencing of the components is kept relatively small. Alternatively, the measurement probe element and/or the electrical circuit are preferably electrically contact-connected according to a wedge-ball bonding method or according to a reverse-stitch-on-ball bonding method (RSOB).

In the same embodiment, in the course of the contact-connection, at least one, preferably a plurality, of the above-mentioned bonding methods is carried out for making contact with different electrical contacts. Preferably, the electronic components are contact-connected by means of the stitch-on-bump bonding method (SOB) and the base element or the leadframe is contact-connected by means of the wedge-ball bonding method or some other wedge bonding method. Alternatively preferably all the electrical contact-connections are carried out by means of the stitch-on-bump bonding method (SOB) or (BSOB).

The contact-connecting pad of the ASIC die may be formed at least partly from aluminum and/or the contact-connecting pad of the measurement probe element from gold. The contact-connecting pad of the ASIC die composed of aluminum is formed, for example, as a metallization having a thickness of less than 1 μm.

Gold wire is preferably used as bonding wire, said gold wire comprising palladium as an additive or being doped with small amounts of palladium.

The contact-connections proposed above enable a high thermal loading capacity, for example for temperatures of up to 180° C., for example for use in motor vehicles, and also a high tensile and shear strength.

A second adhesive may subsequently applied on a second side, lying opposite the first side, of the leadframe or base element. A magnetic medium, such as a ferrite, is then arranged on the second side, in the region opposite the bridge, in such a way that, preferably, the center of mass of the magnet is situated perpendicularly relative to the base element above the center of mass and/or the geometric midpoint of the sensitive area of the measurement probe element. Preferably, in addition an electronic protection element is arranged at a defined distance from the ASIC die optionally on the first side or the second side of the base element. Said protection element may be fitted on the same bonding island as the ASIC die or alternatively preferably at a different location of the base element at a defined distance from the ASIC die. Preferably, the protection element is in this case mechanically and electrically connected to two contact-connecting pins of the base element. This last affords the advantage that the mechanical stability of the connecting pins with respect to the molded housing is improved. In this case, the protection element may be surrounded by the second housing.

The second adhesive is preferably embodied in electrically conductive fashion.

The first and the second adhesive are preferably metered in punctiform fashion or as crossing lines, in such a way that, after the placement process or “die attach”, adhesive is applied to the corners of the respective component to a sufficient extent.

The electronic protection element is preferably embodied as a capacitor or alternatively preferably as a double zener diode or varistor. The electrical contact-making is effected by means of adhesive-bonding connection or wire bonding technology.

Afterward, the second adhesive may be likewise cured by heating.

The heating is carried out, for example, in each case expediently in a furnace.

After the complete process of equipping the leadframe or base element, directly before the encapsulation by molding process, for example carried out as transfer molding, an additional plasma treatment process may be carried out. Said additional plasma treatment process preferably comprises a plasma cleaning process and then a plasma activation process. In this case, the plasma activation process preferably concerns the ASIC die and adhesive and ferrite surfaces, as a result of which better adhesion of the molding material or injection-molding material is made possible.

Transfer molding is preferably understood to mean an injection molding process in which a solid and/or premixed molding material is liquefied under an elevated pressure and elevated temperature and is subsequently conducted into an injection mold, for example under elevated pressure, in which the molding material solidifies or crystallizes out to form a thermosetting plastic body, wherein said thermosetting plastic body is substantially no longer meltable.

The ASIC die, the measurement probe element, and also the magnetic medium may be jointly encapsulated by molding, as a result of which a first housing is formed around these components. Preferably, in addition the electronic protection element is separately encapsulated by molding, as a result of which an additional second housing is formed. Transfer molding is preferably employed as the encapsulation by molding technique.

It is preferably the case that the base element of a sensor element is connected to a base element of other sensor elements by means of connection webs substantially in the form of a chain or strip. After the encapsulation by molding process, the base element are singulated, for example by a stamping process.

The base element may have at least one bonding island/carrier support/die pad, on which the ASIC die and the measurement probe element are arranged on the first side and the magnetic medium is arranged on the second side. Moreover, the base element has at least two contact-connecting terminals, which are connected in part to the bonding island.

After the encapsulation by molding and, preferably, singulation of the base elements or leadframes, the magnetic medium is preferably magnetized. Afterward, preferably, the leadframe is electrically conductively connected to plug terminals or a cable by crimping and/or welding and/or soldering and/or adhesive bonding; in this case, preferably, the contact-connecting terminals will be connected to the plug or cable.

The ASIC die and also the measurement probe element or the bridge die preferably have substantially the same height and therefore project substantially to the same extent from the first side of the base element. In this case, the ASIC die and the bridge die are arranged on the first side of the base element in a manner spaced apart from one another by a defined length. It has been found that this arrangement is advantageous for the joint encapsulation by molding. The defined length between ASIC die and bridge die or this distance is preferably embodied as greater than 40 μm, in order that a the adhesive-bonding process for these components and the subsequent joint encapsulation by molding process are made possible without any problems.

The base element or the leadframe preferably comprises two or more contact-connecting pins which, may be connected to one another by the second housing and which preferably project partly from the third, common housing of the sensor element as contact elements of the sensor element.

The invention also relates to a sensor element produced according to the production method according to aspects of the invention.

Moreover, the invention relates to the use of said sensor element in motor vehicles, for example as a speed sensor element, preferably as a wheel rotational speed sensor element.

The method according to aspects of the invention is preferably provided for producing sensor elements, for example sensor elements for safety-critical applications. Preferably, the method is provided for producing speed sensor elements, preferably for motor vehicles.

BRIEF DESCRIPTION OF THE DRAWINGS

The invention is best understood from the following detailed description when read in connection with the accompanying drawings. Included in the drawings is the following figures.

DETAILED DESCRIPTION OF THE PREFERRED EMBODIMENTS

Figure 1:
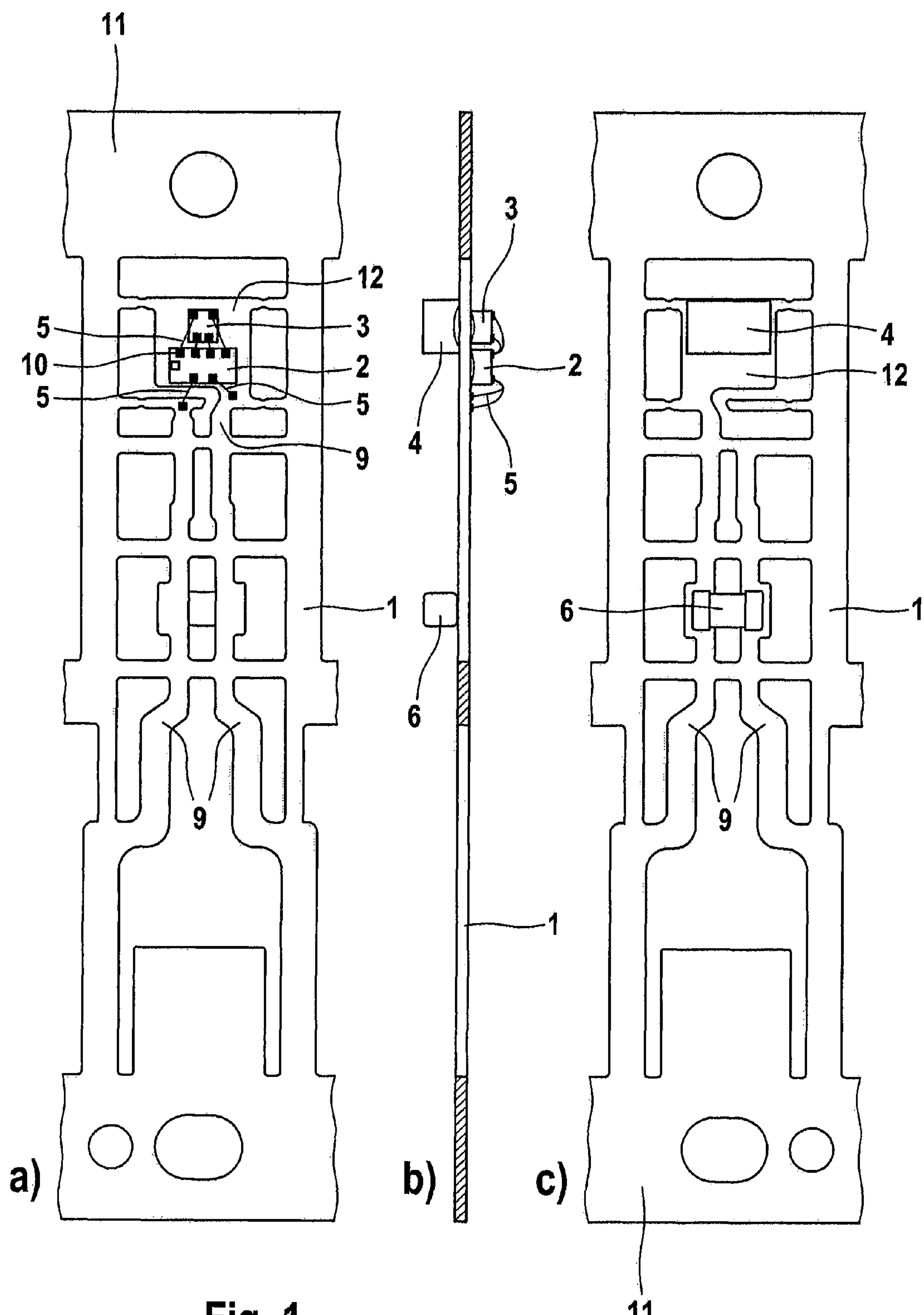
FIGS. 1 to 3 show exemplary embodiments of the sensor element.

FIG. 1 illustrates an exemplary sensor element, wherein FIG. 1 a) shows a plan view of the first side of the base element 1, FIG. 1 b) shows a side view and FIG. 1 c) a plan view of the second side or the underside of the base element 1. According to the example the base element 1 is embodied as a leadframe composed of metal.

The first side of the base element 1 is equipped with a measurement probe element 3 and an ASIC die 2, which are connected to one another and to the contact-connecting pins 9 of the base element 1 by electrical connection means or "wire bonds". The measurement probe element 3 and the ASIC die 2 project from the base element 1 to substantially the same extent, or are embodied with the same height. According to the example, the wiring or electrical contact-connection is embodied in accordance with a ball-stitch-on-ball bonding method, wherein the AU wires 5 are connected to bonding bumps or bumps or gold bumps which are arranged on the contact-connecting pins 9 of the base element 1 and on contact-connecting pads 10 of the measurement probe element 3 and of the ASIC die 2. In the case of the exemplary embodiment illustrated in FIG. 1, the sensor element illustrated is connected with regard to its base element by means of a tape 11 or some other connection to further base elements. Measurement probe element 3 and ASIC die 2 are arranged on a carrier support 12 of the base element 1.

The carrier support 12 or the bonding island, is equipped with a magnetic medium 4, embodied as ferrite, on the second side of the base element 1. Moreover, the second side of the base element 1 is equipped with an electronic protection element 6, embodied as a capacitor element according to the example, said element being arranged at a defined distance from carrier support 12 or ASIC die 2 and being connected to two contact-connecting pins 9.

Figure 2:
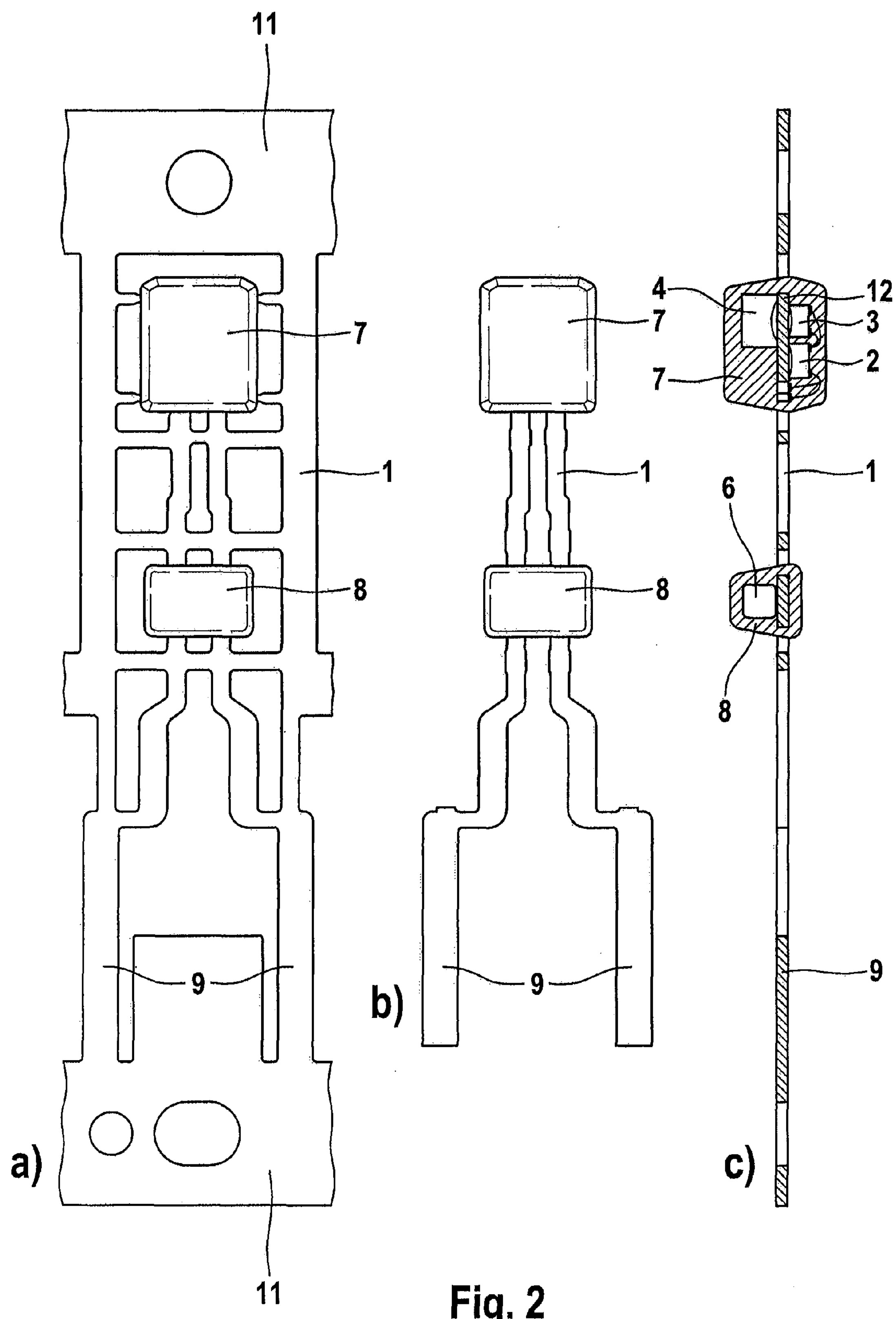

FIG. 2 shows an exemplary embodiment of a sensor element comprising a first and a second housing 7, 8, which is formed from a thermosetting plastic molding compound, for example epoxy, in an injection molding method. In FIG. 2 a), the sensor element is still connected to further sensor elements with regard to its base element 1 by tape 11. In this case, base element 1 has two contact-connecting pins 9 and a carrier support, wherein said carrier support is enveloped by the first housing 7. FIG. 2 b) shows the exemplary sensor element after a singulation process, in which only that part of the base element 1 which is relevant to the later finished sensor element is stamped out and processed further. FIG. 2 c) shows a lateral sectional view of this exemplary sensor element. In this case, first housing 7 composed of injection-molded epoxy contains an ASIC die 2 and a measurement probe element 3, arranged on a first side of the carrier support 12 of the base element 1, and also a magnetic medium 4 or, according to the example, a ferrite, arranged on the second side of said carrier support. The second housing 8 composed of injection-molded epoxy comprises a capacitor element as electronic protection element 6, which is connected to the two contact-connecting pins 9.

Figure 3:
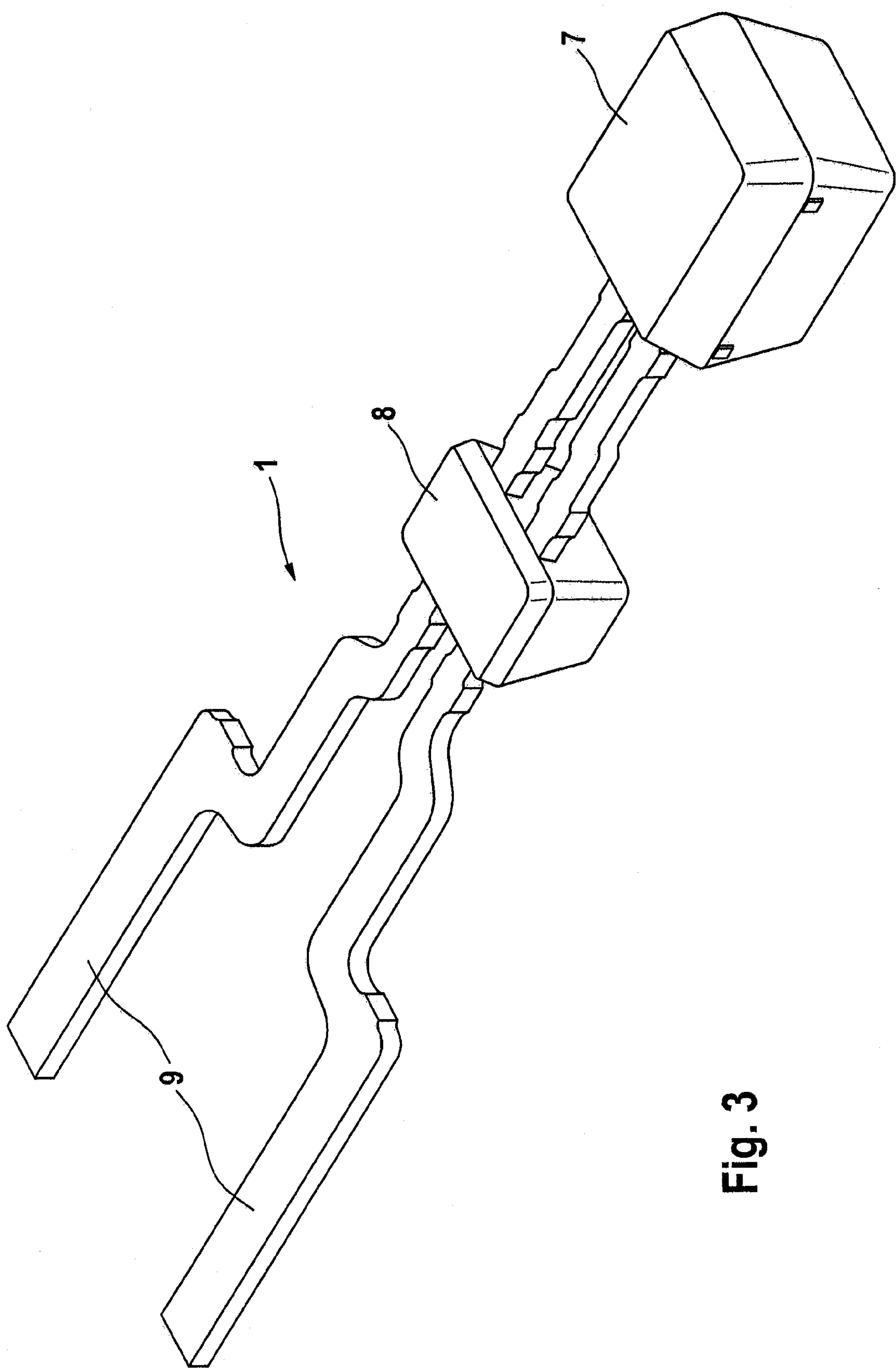

FIG. 3 illustrates an exemplary sensor element comprising a base element 1 with contact-connecting pins 9 and a first 7 and second 8 housing composed of injection-molded material. The first housing 7 comprises a measurement probe element (not illustrated), an ASIC die and also a magnetic medium. The second housing 8 comprises, for example, an electronic protection element or, in an alternative exemplary embodiment, is "empty", consists as only of that part of the base element which is encapsulated by molding and the injection-molding compound itself. In this case, said second housing 8 additionally serves for mechanical load relief, for example strain relief, with regard to the contact-connecting pins 9.

Figure 4:
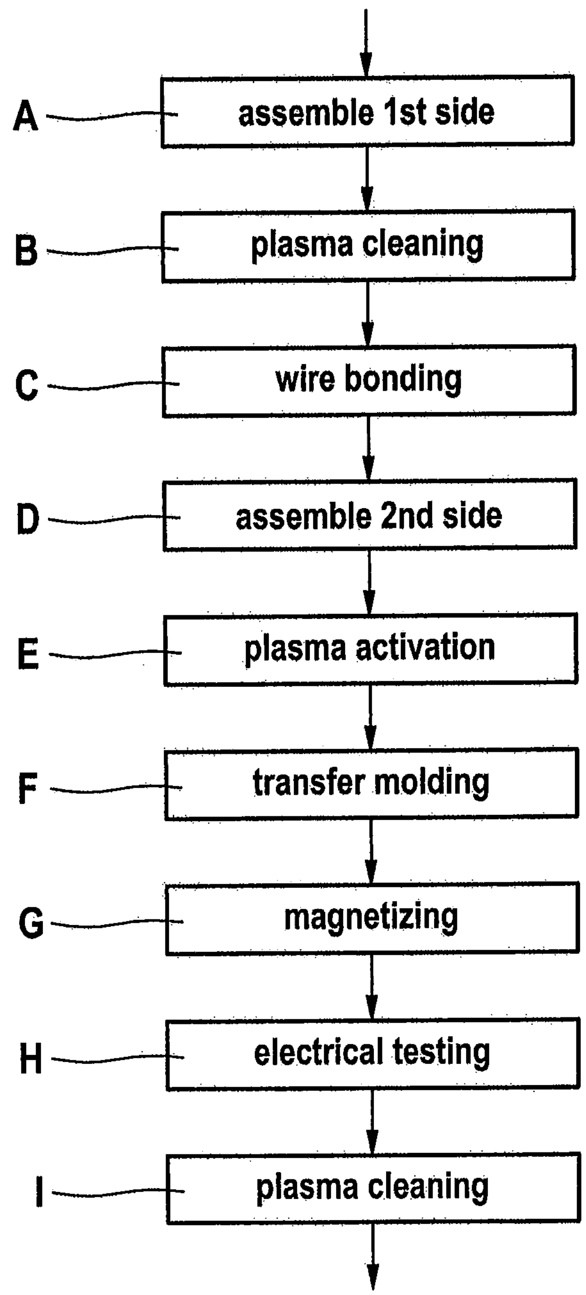
FIG. 4 shows an exemplary flowchart of the method for producing a sensor element.

An exemplary method for producing a sensor element is illustrated in a flowchart with reference to FIG. 4.

In this case, the base element or leadframe is equipped from a first side in a method step A "assemble first side". In said method step A, a first, electrically insulating adhesive having relatively good thermal conductivity is applied to a part of the first side of the base element, according to the example to the first side of a carrier support, which is also referred to as "adhesive dispensing". Afterward, an ASIC die and a measurement probe element are arranged or adhesively bonded on said first side, which can also be referred to as "die attach". Afterward, the first adhesive is cured in a furnace, "curing".

A plasma cleaning process, "plasma cleaning", is subsequently carried out in method step B. This serves to prepare for an electrical contact-connection method.

This is followed by a contact-connection process C, "wire bonding", of the components arranged on the first side of the base element, or of the measurement probe element and of the ASIC die, according to the example according to a ball-stitch-on-ball bonding method with AU wire.

This is followed by a placement process D on the second side of the base element, "assemble 2nd side". In this case, by way of example, a part of the second side of the base element is wetted with a second adhesive, which is electrically conductive, "adhesive dispensing", after which a magnetic medium and an electronic protection element for improving the EMC properties of the sensor element are arranged on the second side, in a manner spaced apart from one another. Afterward, the second adhesive is cured in a furnace, "curing".

After the placement processes, a plasma activation process E, "plasma activation", is carried out or the sensor element is subjected to said plasma activation process.

Afterward, in a plastic injection molding process F, "transfer molding", a first and a second housing are formed, which encompass the components previously arranged on the base element. The injection-molded material of the housing is cured in a furnace, "post mold curing".

This is followed by a magnetization process G of the magnetic medium, after which an electrical test method H, "electrical testing", of the sensor element is carried out, which involves testing the functionality of the measurement probe element in interaction with the magnetic medium and the functionality of the ASIC die.

Afterward, the sensor element is subjected to a plasma cleaning process I, "plasma cleaning", which reduces the corrosion susceptibility of the sensor element or of the exposed electrical contacts of the sensor element. As a result, there is no need to carry out an additional electroplating process, for example tin-plating or nickel-plating of the exposed electrical contacts.

Alternatively, the method does not perform any additional treatment at all of the sensor element for protection against corrosion, but rather a suitable packaging of the sensor element, for example by means of an airtight packaging/in an airtight bag.

The invention claimed is:

1. A method for producing a sensor element, wherein at least parts of the sensor element are subjected to at least one plasma treatment process during production, wherein at least parts of the sensor element are subjected to a plasma cleaning process and a plasma activation process before at least one encapsulation by molding process.

2. The method of claim 1, wherein a base element and/or a carrier element of the sensor element is subjected to a plasma treatment process before a placement process and/or before a contact-connecting process with electrical connection means.

3. The method of claim 2, wherein the plasma treatment process comprises a plasma cleaning process.

4. The method of claim 1, wherein the plasma treatment process comprises a plasma activation process.

5. The method of claim 1, wherein the at least one encapsulation by molding process comprises a plastic injection molding process.

6. The method of claim 1, wherein the sensor element is equipped with at least one measurement probe element and/or at least one electronic circuit.

7. The method of claim 6, wherein the at least one measurement probe element and/or the at least one electronic circuit are arranged directly or indirectly on the base element and/or the carrier element.

8. The method of claim 6, wherein the measurement probe element and/or the electronic circuit are electrically contact-connected according to a ball-stitch-on-ball bonding method.

9. The method of claim 2, wherein the base element and/or the carrier element are equipped with in each case at least one component on both sides.

10. The method of claim 6, wherein at least the measurement probe element and at least one part of the base element and/or of the carrier element are encapsulated by molding as a result of which a first housing is formed, and wherein at least one part of the base element and/or of the carrier element are encapsulated by molding (F), as a result of which a second housing is formed.

11. The method of claim 10, wherein at least one part of the base element and/or of the carrier element and an electronic protection element are encapsulated by molding, as a result of which a second housing is formed.

12. The method of claim 10, wherein the second housing is formed at a defined distance from the first housing.

13. The method of claim 11, wherein the second housing is formed at a defined distance from the first housing.

14. The method of claim 12, wherein the first and the second housing are jointly encapsulated by molding in an additional encapsulation by molding process, as a result of which a common third housing is formed.

15. The method of claim 13, wherein the first and the second housing are jointly encapsulated by molding in an additional encapsulation by molding process, as a result of which a common third housing is formed.

16. The method of claim 1, wherein the sensor element is subjected to an additional plasma treatment process.

17. The method of claim 16, wherein the additional plasma treatment process occurs at the end of the production method.

18. A sensor element wherein at least parts of the sensor element are subjected to a plasma cleaning process and a plasma activation process during production before at least one encapsulation by molding process.

19. A speed sensor element wherein at least parts of the sensor element are subjected to a plasma cleaning process and a plasma activation process during production before at least one encapsulation by molding process.

* * * * *